United States Patent
Kim et al.

(10) Patent No.: US 6,435,428 B2
(45) Date of Patent: Aug. 20, 2002

(54) SHOWERHEAD APPARATUS FOR RADICAL-ASSISTED DEPOSITION

(75) Inventors: Jae Ho Kim, Cheongju; In Chel Shin, Seoul; Sang Joon Park, Daejeon; Kwan Goo Rha, Cheongju; Sang Ho Kim, Daejeon, all of (KR)

(73) Assignee: Apex Co., Ltd., Chungcheongbuk-do (KR)

( * ) Notice: Subject to any disclaimer, the term of this patent is extended or adjusted under 35 U.S.C. 154(b) by 9 days.

(21) Appl. No.: 09/776,004

(22) Filed: Feb. 2, 2001

(30) Foreign Application Priority Data

Feb. 16, 2000  (KR) .............................................. 00-7366

(51) Int. Cl.[7] ................................................ B05B 1/14
(52) U.S. Cl. ...................................... 239/553; 239/590
(58) Field of Search .............................. 239/553, 553.3, 239/553.5, 590, 590.3, 590.5, 690, 706, 708; 118/719, 728, 620

(56) References Cited

U.S. PATENT DOCUMENTS 4,877,757 A * 10/1989 York et al. .................... 134/1.2

* cited by examiner

Primary Examiner—Lisa A. Douglas
(74) Attorney, Agent, or Firm—Akin, Gump, Strauss, Hauer & Feld, L.L.P.

(57) ABSTRACT

There is disclosed a showerhead apparatus for radical-assisted deposition including a showerhead of a two-stair structure separated by a given distance, which has a first buffer for uniformly distributing a raw material gas and a second buffer for uniformly distributing a plasma gas, wherein a plasma is generated within the showerheads and the raw material gas sprayed into the plasma is constantly maintained, thus forming a uniform thin film on a wafer or a substrate. The showerhead apparatus for radical-assisted deposition comprises a raw material gas spray mechanism including a first buffer which is divided into upper and lower layers for uniformly distributing a gas introduced from a raw material gas injection tube, wherein a plurality of raw material gas spray holes for spraying the raw material gas distributed within the first buffer at a given flow rate is formed at a lower plate of the spray mechanism; a plasma generating gas spray mechanism including a second buffer for uniformly distributing a plasma generating gas between with the raw material gas spray mechanism, wherein a plurality of plasma generating gas spray holes and through holes for spraying the plasma generating gas distributed within the second buffer are formed at a lower plate of the spray mechanism, respectively; a guide mechanism for communicating the raw material gas spray holes in the raw material gas spray mechanism and the through holes in the plasma generating gas spray mechanism and for inducing the raw material gas and the plasma generating gas so that they are not mixed; and a RF generating mechanism mounted at one outside side of the raw material gas spray mechanism, wherein a RF rod for applying an outside RF power is included at a lower plate of the RF generating mechanism.

9 Claims, 4 Drawing Sheets

SHOWERHEAD APPARATUS FOR RADICAL-ASSISTED DEPOSITION

TECHNICAL FIELD

The invention relates generally to a showerhead apparatus for radical-assisted deposition in chemical vapor deposition equipment for performing a semiconductor manufacturing process. More particularly, the present invention relates to a showerhead apparatus for radical-assisted deposition in which a showerhead is consisted of a two-stair structure to generate plasma, so that uniformity of a thin film can be improved, the deposition efficiency can be increased and generation of particles is minimized when a thin film is deposited on a large-caliber wafer or a substrate.

BACKGROUND OF THE INVENTION

Generally, in a process of manufacturing a semiconductor, the chemical vapor deposition apparatus for depositing a thin film on a wafer or a substrate employs a plasma in order to deposit a thin film of a high quality at low temperature, whereby a raw material is activated to deposit a thin film on the wafer or the substrate. A conventional apparatus for generating plasmas will be now explained in short by reference to FIG. 1a.

FIG. 1a is a schematic view illustrating an entire structure of a conventional plasma chemical vapor deposition apparatus. The apparatus includes chamber 107 below which an exhaust outlet 106 is formed, a gas injection tube 102 formed through the upper center of the chamber 107 for injecting a plasma generating gas, a showerhead 110 having a plurality of holes, for spraying the plasma generating gas induced from the gas injection tube 102, which is surrounded by a shield 104 and is also mounted under the gas injection tube 102, a shower ring 103 mounted below the showerhead 110 for spraying a raw material gas supplied from a raw material gas injection tube 101 when a plasma is used, a substrate 108 on which a thin film is deposited the gas sprayed from the shower ring 103 and a heater 109 supporting the substrate 108 for providing a given thermal source to the substrate.

At this time, an insulating plate 105 having an electrode plate for generating a plasma by an outside RF power supply (not shown) is formed on the chamber 107 at the portion of which the gas injection tube 102 passes through. Also, the shower ring 103 is separated from the plasma generating apparatus.

In the above conventional structure, it is impossible to accurately adjust the raw material gas since the shower ring 103 is directly exposed to the plasma generating gas passing through the showerhead 110 due to the temperature elevated by the plasma. This results in degrading the quality of a thin film to be grown. Also, in case of employing a large-caliber wafer, as it is difficult to uniformly spray a raw material gas on the entire surface of the wafer, forming a uniform thin film is made impossible. Further, as the distance between the shower ring and the wafer or the shower ring and the substrate is distant, there is a problem that the deposition efficiency of the raw material gas is degraded.

In order to overcome the above problems, Korean Patent Application No. 99-0243446 proposes a showerhead apparatus including a plasma generating section, which includes a showerhead of a two-stair structure the upper and lower portion of which has a buffer, respectively, whereby the raw material gas sprayed into the plasma can be constantly distributed to form a uniform thin film on a wafer or a substrate.

FIG. 1b is a schematic view of the showerhead apparatus including the above plasma generating section. The showerhead apparatus includes first and second showerheads 201 and 202 having a two-stair structure, the upper and lower portion of which has buffers 201a and 202a, respectively. Here, the showerhead is constructed wherein a plasma is generated by the first upper buffer 201a of the first showerhead 201, the plasma is sprayed on a wafer 203 through a plasma spray hole 201b passing through the second buffer 202a, a raw material gas is injected into the second buffer 202a of the second showerhead 202 and the raw material gas is sprayed through a plurality of raw material gas spray holes 202b formed at the below plate of the second buffer 202a. In the above conventional showerhead apparatus, however, the generated plasma is introduced into the chamber through the plasma spray holes passing through the second buffer, so that the probability or the number in which particles constituting plasmas such as positive ions, electrons, radical etc. collide each other within the spray hole or collide against the internal wall of the spray hole is increased. Thus, there is a drawback that the plasma efficiency is decreased due to loss of the energy. In addition, as the raw material gas introduced into the second buffer is caused to spiral heavily within the second buffer by the plurality of plasma spray holes formed at the second buffer, there are problems that the internal of the showerhead is contaminated and a lot of particles are generated.

SUMMARY OF THE INVENTION

The present invention is contrived to solve the above problems and an object of the present invention is to provide a showerhead apparatus for radical-assisted deposition including a showerhead of a two-stair structure separated by a given distance, which has a first buffer for uniformly distributing a raw material gas and a second buffer for uniformly distributing a plasma gas, wherein a plasma is generated within the showerheads and the raw material gas sprayed into the plasma is constantly maintained, thus forming a uniform thin film on a wafer or a substrate.

Also, another object of the present invention is to provide a showerhead apparatus for radical-assisted deposition capable of forming a thin film of a high quality at a low-temperature process while simplifying the structure of two-stair showerheads having a first buffer and a second buffer.

In order to accomplish the above object, the present invention provides a showerhead apparatus for radical-assisted deposition comprising a raw material gas spray means including a first buffer which is divided into upper and lower layers for uniformly distributing a gas introduced from a raw material gas injection tube, wherein a plurality of raw material gas spray holes for spraying the raw material gas distributed within the first buffer at a given flow rate is formed at a lower plate of the spray means; a plasma generating gas spray means including a second buffer for uniformly distributing a plasma generating gas between with the raw material gas spray means, wherein a plurality of plasma generating gas spray holes and through holes for spraying the plasma generating gas distributed within the second buffer are formed at a lower plate of the spray means, respectively; a guide means for communicating the raw material gas spray holes in the raw material gas spray means and the through holes in the plasma generating gas spray means and for inducing the raw material gas and the plasma generating gas so that they are not mixed; and a RF generating means mounted at one outside side of the raw material gas spray means, wherein a RF rod for applying an outside RF power is included at a lower plate of the RF generating means.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1A:
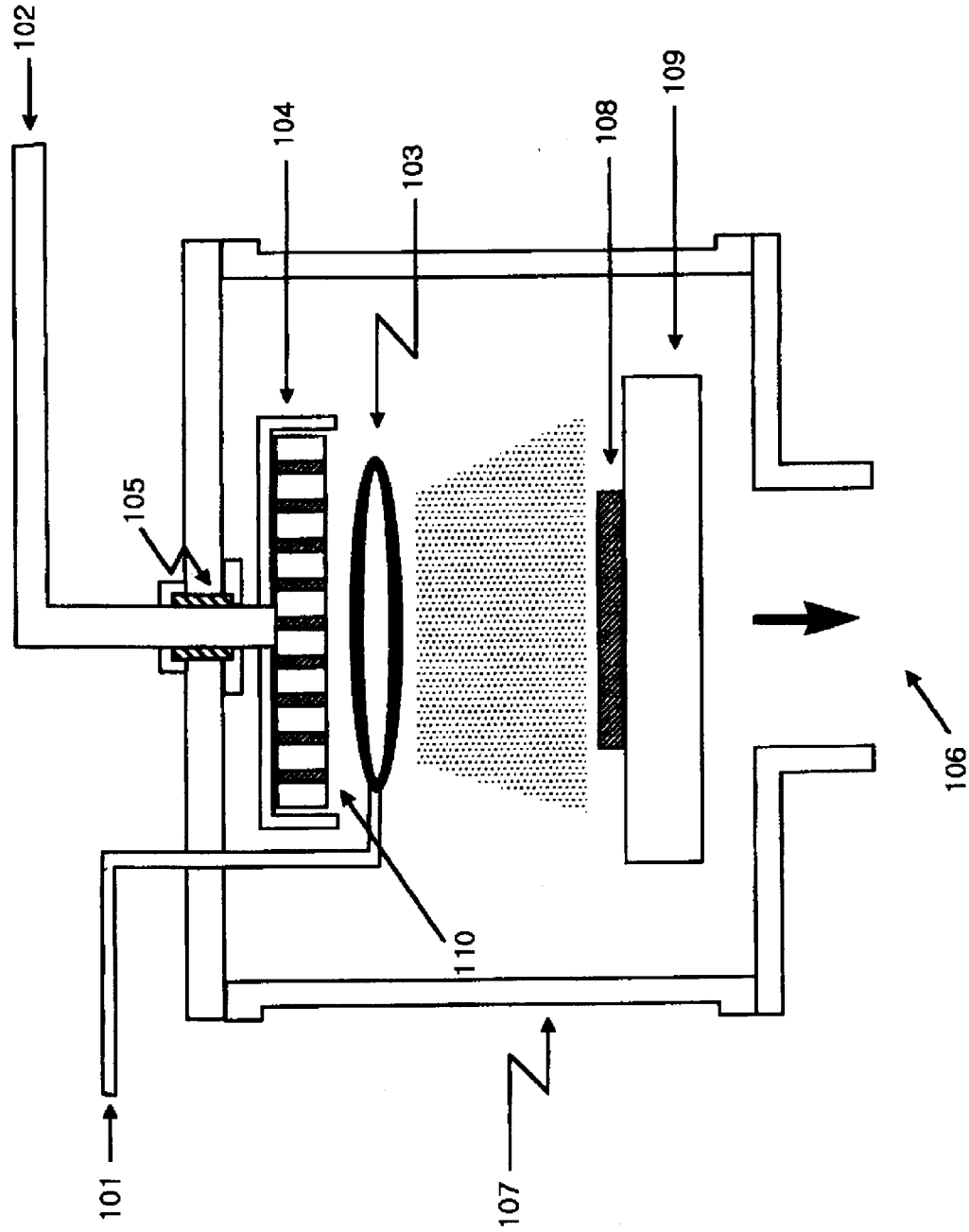
FIG. 1a is a schematic view illustrating a conventional plasma chemical vapor deposition apparatus.
Figure 1B:
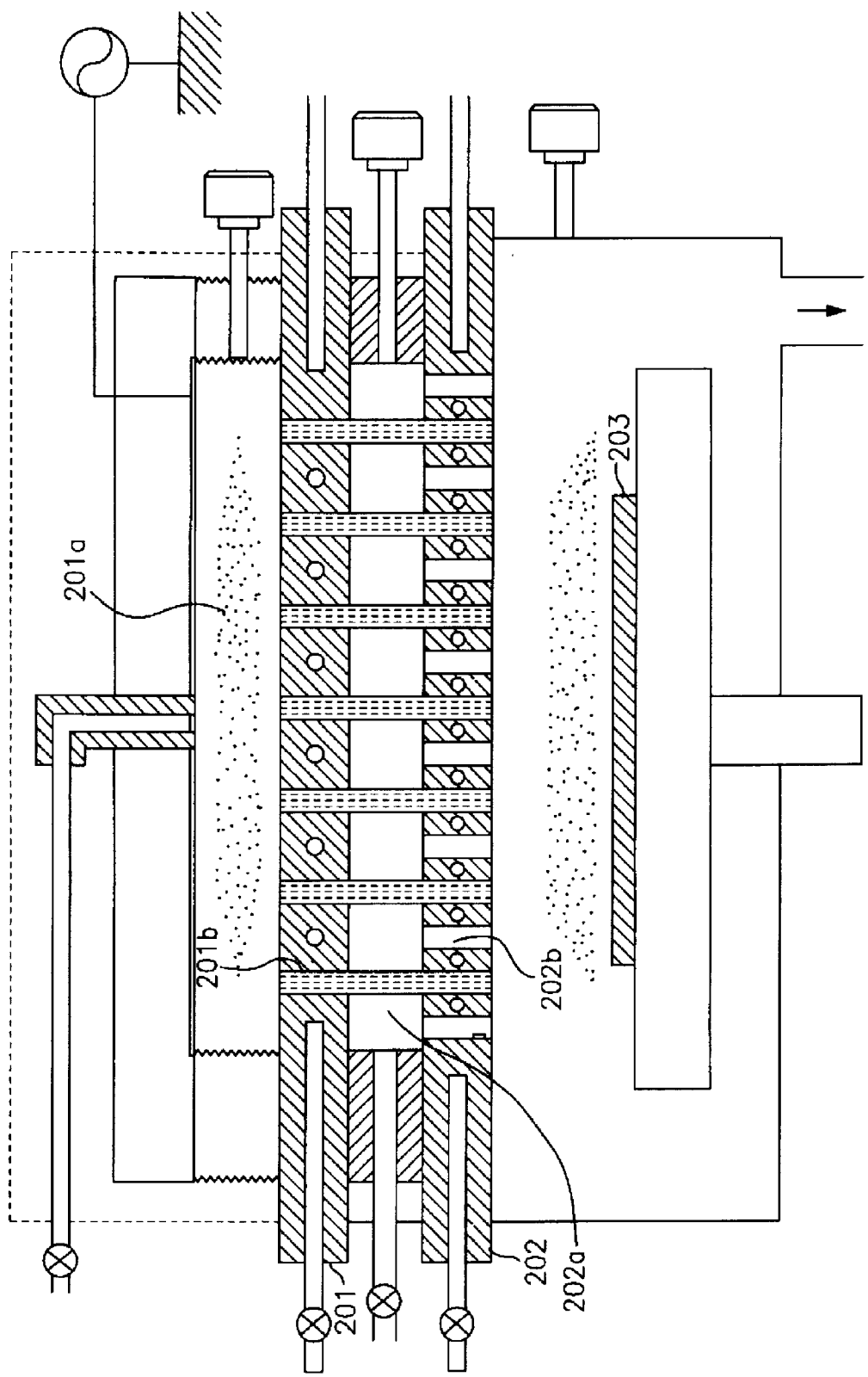
FIG. 1b is a front view for illustrating a showerhead having a conventional plasma generator.
Figure 2:
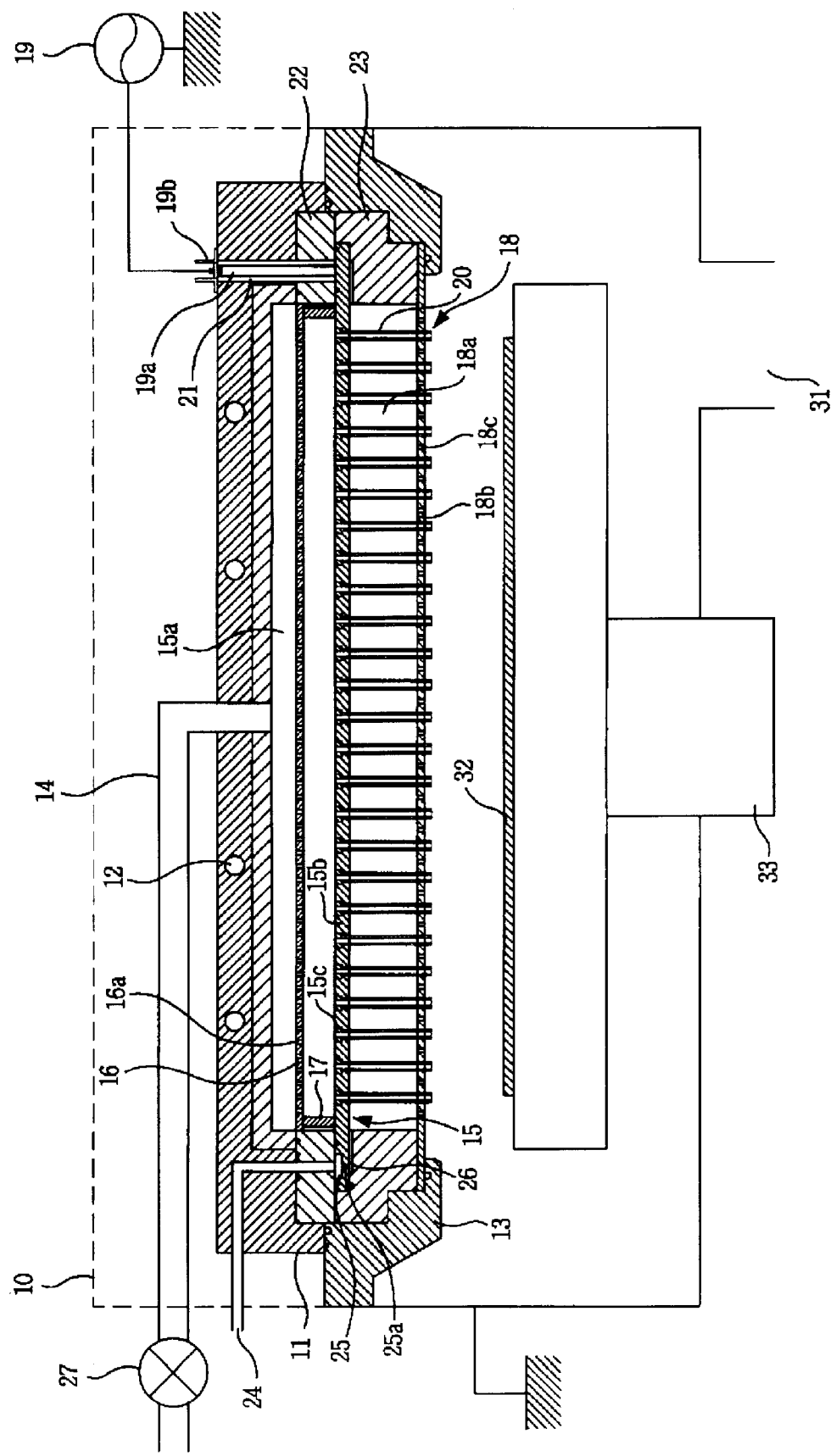
FIG. 2 is a front view of a showerhead apparatus for radical-assisted deposition according to one embodiment of the present invention.
Figure 3:
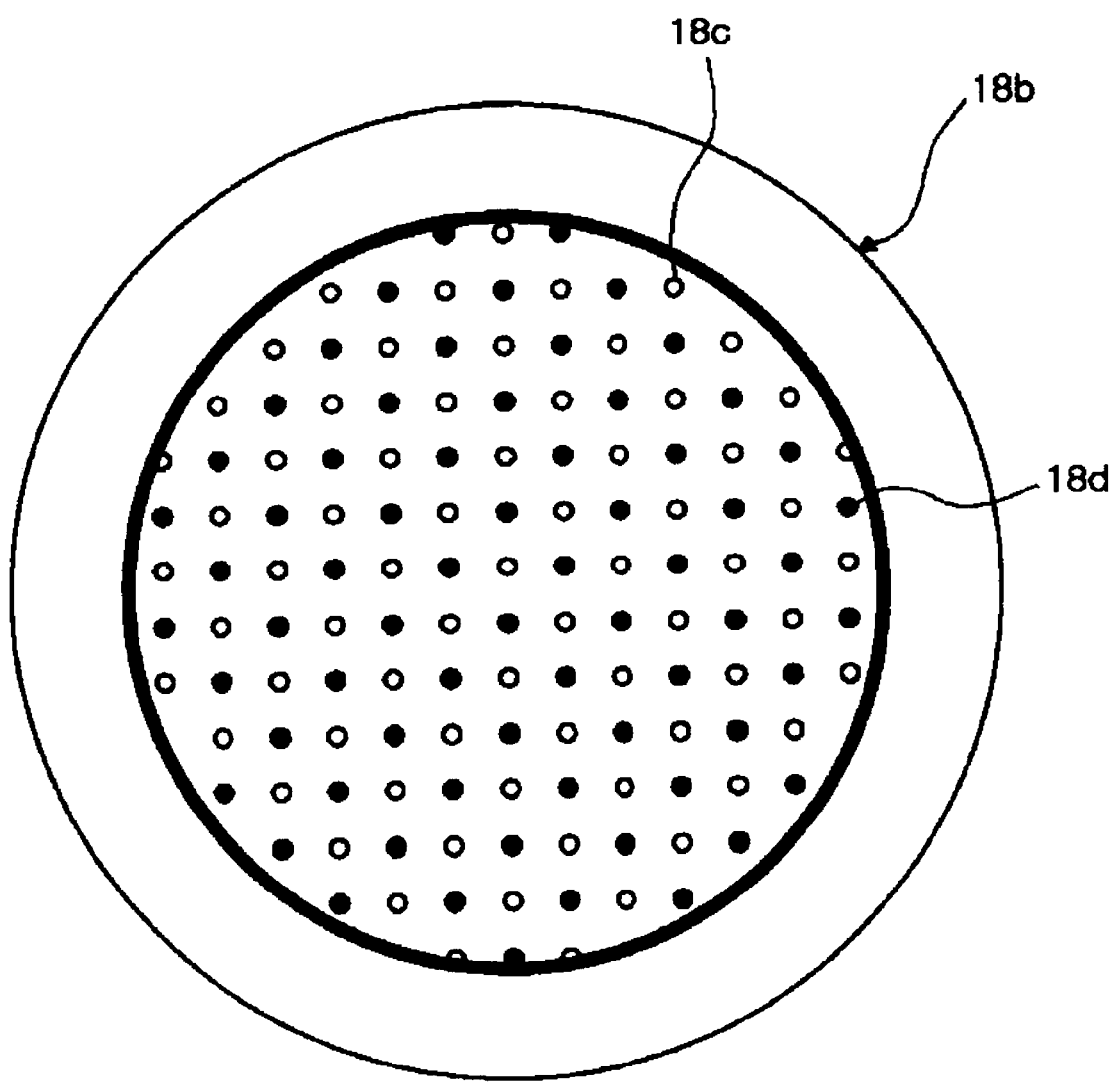
FIG. 3 is a plan view of a bottom plate of a second showerhead being an integral part of the present invention.

A preferred embodiment of the present invention will be described in detail with reference to accompanying FIGS. 2 and 3.

A showerhead apparatus for radical-assisted deposition according to the present invention sprays separately a raw material gas and a plasma generating gas, wherein the plasma is used to activate the raw material gas, thus improving uniformity and the quality of a thin film. As shown in FIG. 2, the showerhead apparatus includes an upper plate 11 formed at an internal upper side of the chamber 10 for performing a process and having a first heater 12 for uniformly maintaining the temperature of a raw material gas therein, a lower plate 13 the side of which is fixed at the chamber 10, for supporting the upper plate 11, a raw material injection tube 14 formed at the central portion of the upper plate 11, for supplying the raw material gas through it and a mass flow controller 27 formed at a given position of the raw material gas injection tube 14, for controlled the inflow of the gas.

Also, a first buffer 15a for uniformly distributing the gas introduced from the raw material gas injection tube 14 is formed within the upper plate 11. Further, a first showerhead 15, wherein a plurality of raw material gas spray holes 15c through which the raw material gas distributed within the first buffer 15a is sprayed at a given flow rate are formed, is formed at a lower plate 15b.

Here, the lower plate 15b of the first showerhead 15 is formed of an electrode plate, from which plasma is generated by RF applied from a RF power supply to be explained later. The first showerhead 15 has the first buffer 15a that is divided into upper and lower spaces. Further the first showerhead 15 includes a middle plate 16 having a plurality of exhaust holes 16a for uniformly distributing the raw material gas distributed into the upper space of the showerhead into the lower space of the showerhead, and a support pin 17 erectly formed at the circumferential face of the lower plate 15b in the first shower head 15 for supporting the middle plate 16 in order to form a lower space between the middle plate 16 and itself.

At the lower portion of the first showerhead 15 is formed a second buffer 18a for uniformly distributing the flow of the plasma generating gas between itself and the first showerhead 15. Also, there is formed a second showerhead 18 for spraying the plasma generating gas distributed within the second buffer 18a, wherein a plurality of plasma generating gas spray holes 18c are formed at the lower plate 18b of the second showerhead 18. Then, as shown in FIG. 3, a through hole 18d facing the hole 15c formed at the lower plate 15b of the first showerhead 15 is formed around the spray holes 18c formed at the lower plate 18b of the second showerhead 18.

In addition, a RF power 19 having a RF rod 19a and a RF connector 19b which apply an outside RF power supply to the lower plate 15b of the first showerhead 15 is formed to be uprightly through the upper plate 11 at one side of the first showerhead 15.

Meanwhile, in order for the raw material gas and the plasma generating gas not to be mixed together, a guide tube 20 made of an insulator, one side of which is mounted at the raw material gas spray hole 15c in the first showerhead 15 and the other side of which passes through the through hole 18d in the second showerhead 18, is formed.

A first insulating member 21 is formed at a circumferential face of the RF rod 19a in the RF power 19, and a second insulating member 22 for covering the first buffer 15a is formed between the upper portion of the first buffer 15a and the upper plate 11 in the first showerhead 15. Also, a third insulating member 23 is formed at a circumferential face of the second buffer 18a in the second showerhead 18 in order to keep the upper and lower width of the second buffer 18a. At this time, the second and third insulating members 22 and 23 are supported by the lower plate 13 and the first to third insulating members 21, 22 and 23 function to electrically insulate the RF power supply applied to the lower plate 15b in the first showerhead 15.

Further, a plasma gas inlet tube 24 for supplying a plasma gas into the second buffer 18a of the second showerhead 18 is formed at one circumferential side of the lower plate 15b in the first showerhead 15. Also, a plasma gas buffer 25 is formed at a lower portion of which a plasma gas distribution hole 25a is formed at one circumferential side of the lower plate 15b in the first showerhead 15 so that the plasma gas buffer 25 can communicate with the plasma gas inlet tube 24. A gas passage 26 for introducing the plasma gas into the second buffer 18a along with the plasma gas distribution hole 25a is formed between the lower plate 15b and the third insulating member 23, is formed.

An unexplained reference numeral 31 indicates an exhaust port for exhausting the gas within the chamber 10 toward the outside, 32 indicates a wafer or a substrate on which a raw material gas activated by the plasma generating gas sprayed from the second showerhead 18 is deposited to form a thin film and 33 indicates a second heater supporting the substrate 32, for providing a given thermal source to the substrate 32.

An embodiment of the present invention constructed above will be in detail explained below.

First, if the gas supplied from the plasma generating gas inlet tube 24 is introduced into the second buffer 18a in the second showerhead 18 via the plasma gas distribution hole 25a in the gas buffer 25 and the gas passage 26, the electric power from the RF power 19 is applied to the lower plate 15b in the first showerhead 15 via the RF rod 19a, thus generating a plasma. The plasma thus generated is sprayed into the substrate 32 via the plasma generating gas spray holes 18c from at the lower plate 18b in the second showerhead 18 while is maintained at a constant fluid pressure within the second buffer 18a. Also, the raw material gas from the raw material gas injection tube 14 is introduced into the upper space formed at the first buffer 15a of the first showerhead 15. Then, this gas is again introduced into the lower space in the first buffer 15a via the holes 16a in the middle plate 16, so that the fluid pressure of the raw material gas is uniformly distributed. At this time, the heater built in the upper plate 11 constantly maintains the temperature of the raw material gas distributed within the first buffer 15a of the first showerhead 15.

Then, the raw material gas distributed within the first buffer 15a in the first showerhead 15 is sprayed onto the substrate 32 via the spray holes 15c formed at the lower plate 15b of the first showerhead 15 and the guide tube 20 communicating with the through hole 18d formed at the lower plate 18b.

As mentioned above, the raw material gas passed through the guide tube 20 after being distributed into the first buffer 15 and the neutral radical of the plasma generating gas passed through the spray holes 18c in the second showerhead 18 are sprayed onto the substrate with the two being separated to each other. During this process, reaction of the raw material gas with the neutral radical is prevented. Thus, vapor reaction that becomes a major reason in generation of particles can be prohibited, and a thin film having a uniform and good quality can be formed on the wafer or the substrate 32.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

As mentioned above, the present invention provides a two-stair showerhead structure in which the plasma generating section and the raw material gas spray section are incorporated. Thus, the present invention can prevent collision and injection of ions and electros, which caused a problem in a deposition process using conventional plasma generation. Also, introduction of impurities such as carbon (C), hydrogen (H), chlorine (Cl), brome (Br), etc. and a large quantity of particles, which existed when a metal organic source or a metal inorganic source is used a raw material gas, can be prevented. In addition, as the passage through which the radical generated from the showerhead apparatus is introduced into the chamber can be maintained at its minimum, the efficiency of radical can be maximized. Also, according to the present invention, as a thin film of a high quality can be formed at a low-temperature process, reliability of the process can be improved and the throughput of the product can be increased.

What is claimed:

1. A showerhead apparatus for radical-assisted deposition, comprising:

a raw material gas spray means including a first buffer which is divided into upper and lower layers for uniformly distributing a gas introduced from a raw material gas injection tube, wherein a plurality of raw material gas spray holes for spraying said raw material gas distributed within said first buffer at a given flow rate is formed at a lower plate of said spray means;

a plasma generating gas spray means including a second buffer for uniformly distributing a plasma generating gas between with said raw material gas spray means, wherein a plurality of plasma generating gas spray holes and through holes for spraying said plasma generating gas distributed within said second buffer are formed at a lower plate of said spray means, respectively;

a guide means for communicating said raw material gas spray holes in said raw material gas spray means and said through holes in said plasma generating gas spray means and for inducing said raw material gas and said plasma generating gas so that they are not mixed; and a RF generating means mounted at one outside side of said raw material gas spray means, wherein a RF rod for applying an outside RF power is included at a lower plate of said RF generating means.

2. The showerhead apparatus for radical-assisted deposition according to claim 1, wherein said raw material gas spray means further includes a middle plate for dividing said first buffer into upper and lower spaces and for uniformly distributing said raw material gas distributed into said upper space into said lower space.

3. The showerhead apparatus for radical-assisted deposition according to claim 2, further including a support pin erectly formed at the circumferential face of said lower plate in said raw material gas spray means, for supporting said middle plate in order to form a lower space between with said middle plate.

4. The showerhead apparatus for radical-assisted deposition according to claim 1, wherein the lower plate of said raw material gas spray means is made of an electrode plate.

5. The showerhead apparatus for radical-assisted deposition according to claim 1, further including:

a first insulating member formed at a circumferential face of said RF rod generating means;

a second insulating member formed to cover the upper portion of said first buffer in said raw material gas spray means; and a third insulating member formed at a circumferential face of said second buffer in said plasma generating gas spray means, for maintaining the upper and below width of said second buffer, wherein said first through third insulating member electrically insulate said RF power applied to the lower plate in the raw material gas spray means.

6. The showerhead apparatus for radical-assisted deposition according to claim 5, further including:

a upper plate formed to surround the outer side of said second insulating member; and a lower plate, the side of which is fixed at a chamber, for supporting said upper plate and said third insulating member.

7. The showerhead apparatus for radical-assisted deposition according to claim 6, further including a heating means built in said upper plate, for maintaining the raw material gas distributed in said first buffer of said raw material gas spray means at a constant temperature.

8. The showerhead apparatus for radical-assisted deposition according to claim 1, further including:

a raw material gas injection tube for supplying a raw material gas into said first buffer of said raw material gas spray means through said upper plate and said second insulting member;

a mass flow controller formed at a given position of said raw material gas injection tube, for controlling the gas introduced into said first buffer; and a plasma gas guide tube for supplying a plasma gas into said second buffer of said plasma generating gas supply means through one circumferential face of said raw material gas spray means.

9. The showerhead apparatus for radical-assisted deposition according to claim 1, further including:

a plasma gas buffer formed at one circumferential face of the lower plate in said raw material gas spray means and communicating with said plasma gas injection tube, wherein plasma gas distribution holes are formed at the bottom of said plasma gas buffer; and a gas passage formed between the lower plate of said raw material gas spray means and said third insulating member, for introducing a plasma gas into said second buffer through said plasma gas distribution holes.

* * * * *